United States Patent [19]

Echols et al.

[11] Patent Number: 4,992,987
[45] Date of Patent: Feb. 12, 1991

[54] BATTERY PACKAGE FOR INTEGRATED CIRCUITS

[75] Inventors: Robert E. Echols, Lewisville, Tex.; John R. Sanderson, Chicago, Ill.; Richard D. Cyr, Appleton; Robert J. Bosben, Madison, both of Wis.

[73] Assignees: SGS-Thomson Microelectronics, Inc., Carrollton, Tex.; Rayovac Corporation, Madison, Wis.

[21] Appl. No.: 397,643

[22] Filed: Aug. 22, 1989

Related U.S. Application Data

[63] Continuation of Ser. No. 330,977, Mar. 29, 1989, abandoned, which is a continuation of Ser. No. 52,777, May 21, 1987, abandoned.

[51] Int. Cl.⁵ .................. G11C 11/24; H01M 2/10; H02J 7/00
[52] U.S. Cl. .................. 365/229; 365/226; 429/96; 429/98; 429/99; 307/66; 29/623.2
[58] Field of Search .................. 365/226, 229; 429/96–100; 29/623.2; 307/66

[56] References Cited

U.S. PATENT DOCUMENTS 4,381,458  4/1983  Anstey et al. .................. 307/66
4,645,943  2/1987  Smith, Jr. et al. .................. 307/150
4,713,555  12/1987  Lee .................. 307/66

FOREIGN PATENT DOCUMENTS

2067018 A  6/1979  United Kingdom .

Primary Examiner—Stephen J. Kalafut
Attorney, Agent, or Firm—Kenneth C. Hill; Richard K. Robinson

[57] ABSTRACT

A battery package for an integrated circuit having a container member with a floor and side walls; a pair of grooves through the inside surface of the side walls. A battery is disposed within the container, connected to two generally planar, electrically conductive contacts each having generally perpendicular, integral, pin portion formed on one end thereof. Each contact is attached to one of the battery terminals such that its pin is positioned within one of the grooves and extends above said upper container surface. The second contact is attached such that the portion of said second contact next adjacent said pin is positioned on a platform within the groove. A sealing composition envelops the battery, contacts, and a portion of the pins. The package is electrically attached to a dual-in-line integrated circuit member and the junction is sealed.

20 Claims, 1 Drawing Sheet

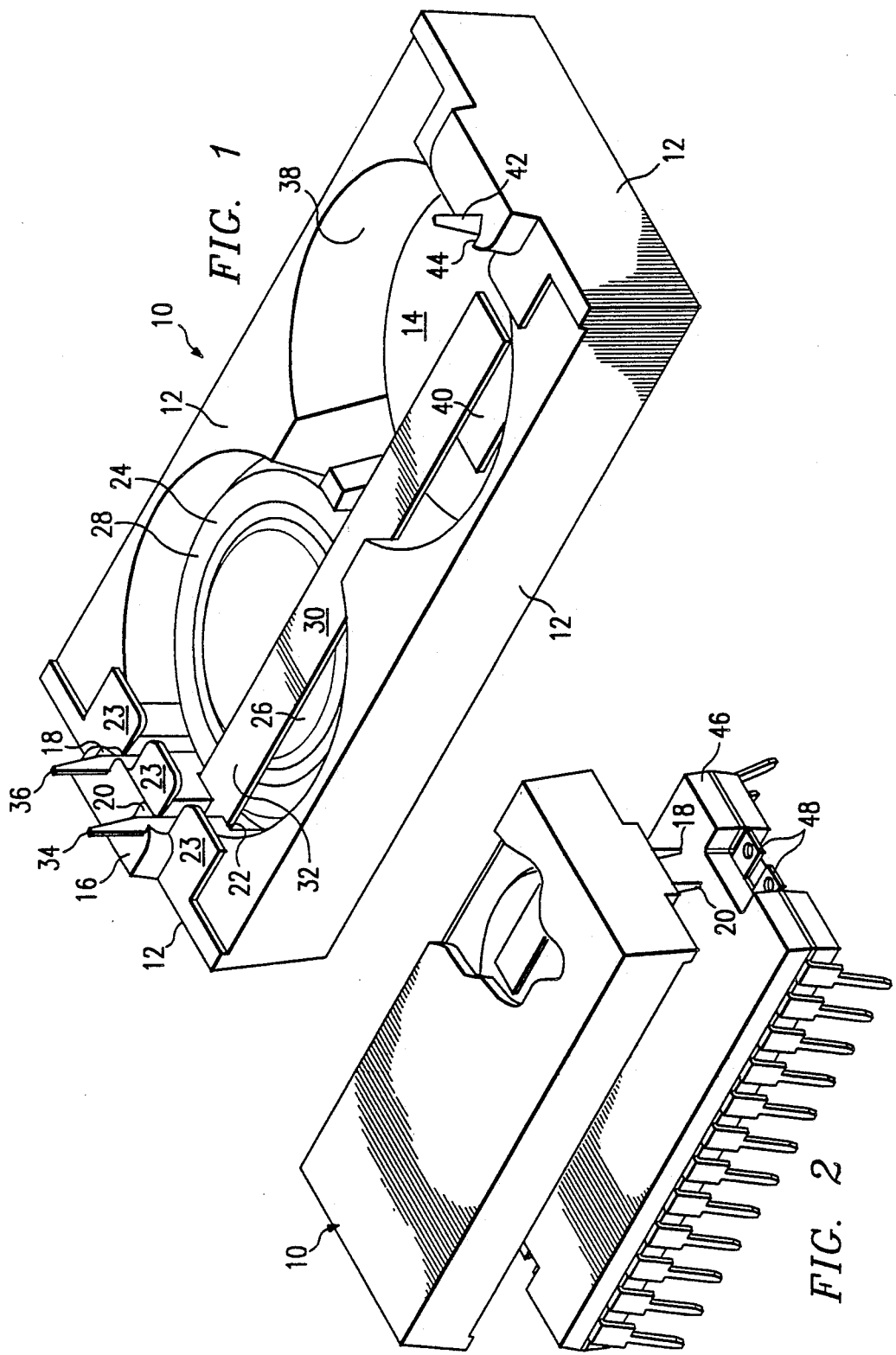

BATTERY PACKAGE FOR INTEGRATED CIRCUITS

This application is a continuation of application Ser. No. 330,977, filed 03/29/89, abandoned which is a Continuation of application Ser. No. 07/052,777, filed May 21, 1987, now abandoned.

BACKGROUND OF THE INVENTION

The present invention relates to battery packages, or more particularly to battery packages which are electrically connected to integrated circuits wherein the entire structure is sealed against contamination from battery leakage. Electronic devices which comprise integrated circuit components are usually powered by an external electric supply. However, it is increasingly desired to provide these components with a back-up battery to assure continued retention of stored information in the event of a power loss from the primary supply. Many attempts have been made to connect lithium or nickel cadmium type batteries to printed circuit boards by welding tabs to the battery and then soldering the tabs directly to the PC board. Although these techniques have had some measure of success, they have not met the goal of long term battery reliability and are not conducive to the mass production automation methods required to hold down manufacturing costs. It is also known in the art to provide a dual-in-line integrated circuit package with a covering battery containing housing which serves as a back-up power source.

However, when subjected to normal operating temperature conditions such has a tendency to leak chemicals from inside the battery. These work their way out of the battery housing and contaminate the integrated circuit below it. Such batteries also tend to degenerate prematurely. The present invention provides a battery package for an integrated circuit which solves these problems. The batteries are set in an environment which extends their useful life and they do not leak onto the attached integrated circuit. Electrical contacts are permanently attached to the battery and to the integrated circuit and there is no need for the end purchaser to attach the battery contacts themselves directly to a PC board.

SUMMARY OF THE INVENTION

The invention provides a battery package which comprises:
(a) a generally hollow container member defined by a floor and side walls attached to the floor, said side walls having an open upper lip surface; a groove through the inside surface of one of said side walls extending from said upper lip surface to said floor; a second groove through the inside surface of one of said side walls extending from said upper lip, part of the distance toward said floor, thus defining a platform at the lowermost portion of said second groove; and
(b) a battery disposed within the hollow container, said battery having upper and lower terminals; and
(c) first and second generally planar, electrically conductive contacts each having a generally perpendicular, integral, pin portion formed on one end thereof; said first contact being attached to said lower battery terminal such that its pin is positioned within said first groove and extends above said upper lip surface; said second contact being attached to said upper battery terminal such that its pin is positioned within said second groove and extends above said upper lip surface and the portion of said second contact next adjacent said pin is positioned on said platform; and
(d) a sealing composition enveloping said battery, contacts, and the portion of said pins below said lip surface.

The invention further provides a battery package additionally comprising a third groove through the inside surface of one of said side walls extending from said upper lip surface to said floor; a second battery having upper and lower terminals disposed within said container; a third generally planar, electrically conductive contact having a generally perpendicular, integral, pin portion formed on one end thereof, said third contact being attached to the lower terminal of said second battery such that its pin is positioned within said third groove and extends above said upper lip surface; said second contact being attached to the upper terminals of both batteries; and a sealing composition enveloping said second battery, third contact and pin below said upper lip surface.

The invention further provides a battery powered integrated circuit article which comprises a dual-in-line integrated circuit member; the above described battery package which is electrically connected thereto by means of said pins at a junction; and a sealing composition enveloping said junction. Still further, the invention provides a method for producing a battery package which comprises:
(a) providing a generally hollow container member defined by a floor and side walls attached to the floor, said side walls having an open upper lip surface; a groove through the inside surface of one of said side walls extending from said upper lip surface to said floor; a second groove through the inside surface of one of said side walls extending from said upper lip, part of the distance toward said floor, thus defining a platform at the lowermost portion of said second groove; and
(b) providing a battery having upper and lower terminals; and
(c) providing first and second generally planar, electrically conductive contacts each having a generally perpendicular, integral, pin portion formed on one end thereof; attaching said first contact to said lower battery terminal and attaching said second contact to said upper battery terminal; inserting said second contact into said container such that its pin is positioned within said second groove and extends above said upper lip surface and the portion of said second contact next adjacent said pin is positioned on said platform; and inserting said first contact into said container such that its pin is positioned within said first groove and extends above said upper lip surface; and
(d) enveloping said battery, contacts, and the portion of said pins below said lip surface with a sealing composition.

BRIEF DESCRIPTION OF THE DRAWINGS

FIG. 1 shows a perspective view of one embodiment of the battery package of the present invention.

FIG. 2 illustrates a partially cut-away perspective view of the battery powered integrated circuit article of the present invention.

DETAILED DESCRIPTION OF THE PREFERRED EMBODIMENT

As exemplified in drawing FIG. 1, the battery package of the present invention provides a container member 10, composed of side walls 12, and floor 14. The container is hollow in the center and in the preferred embodiment is molded in a circular configuration in order to conform to the outline of a generally cylindrical battery.

The walls have an upper lip surface 16 which represents the high point of the container member proper. The side walls are provided with at least two grooves 18 and 20. Groove 18 extends from the upper lip surface of the container to the floor of the container. Groove 20 extends from the upper lip surface to a point in between the lip surface and the floor and terminates at a platform point 22 at a level which approximates the height of the battery. The grooves may have dam members 23 which assist in preventing solder migration into the container during subsequent wave soldering operations. The housing may be comprised of any suitable plastic material which may be injection molded. Such include polycarbonates; Valox, DaP or Ryton-R3.

In the preferred embodiment, battery 24 is composed of upper and lower terminals, 26 and 28 respectively. Suitable batter non-exclusively include BR1225 power cells The battery package provides an upper battery contact 30 which is composed of a generally flat bar portion 32 and an integral pin portion 34. In the preferred embodiment, the pin portion is formed by bending the end part of flat bar 32 at a 90 degree angle and tapering the end to a pinpoint. The pinspoints may or may not be tinned. In operation, flat portion 30 is attached to upper battery terminal 26, for example by spot welding. The pin end of the contact is then angled into groove 20 such that the pin is held within the groove, and the part of the contact next adjacent the pin rests on platform 22. Pin 36 is formed in a similar manner but is attached to the under side of the lower terminal of battery 24 and the contact rests on the floor of the container. In the indicated drawing figure, both contact pins appear on the same side wall. In another embodiment of the invention, one of the pins may be placed on an opposite side wall. In still another embodiment of the invention as is particularly illustrated in FIG. 1, the container is provided with a hollowed center which is molded to accommodate a second battery, not shown, within the cavity. In this embodiment, it is preferred that the same contact 30 is attached to the upper terminal of this second battery. The lower terminal is them attached to a third contact 40, having pin end 42 retained within third groove 44. Groove 44 extends to the floor of the container. Once the contacts and batteries are fixed into position in the container, the batteries, contacts and end pin portions below the lip surface are enveloped with a sealing composition. This sealing composition is preferably a silicone, polyurethane, polyester, epoxy, epoxy/polyamide, or acrylic in fluid form which is poured onto these parts. One preferred encapsulant is a flame retardant epoxy material available as Amicon 5297A/3083-32B.

The sealing composition is then cured to hardness for a length of time and under such ambient conditions as may be necessary to effect such curing. Such conditions are readily determinable by the skilled artisan depending on the particular application and end use desired. It is preferred that the cured sealing composition be able to withstand temperatures in the range of from about 100 degrees Centigrade to about −10 degrees Centigrade. It is most preferred that the sealing composition be essentially flame retarding. The selection of flame retardants is also within the purview of the skilled artisan.

The invention also provides a battery powered integrated circuit article as shown in FIG. 2 The article provides a well known dual-in-line (DIP) type integrated circuit package 46. The battery package 10 is electrically connected to the integrated circuit at a junction defined by the connection of pins 18 and 20 with connectors 48. Connection is secured by standard wave soldering techniques Similar connectors appear on the opposite side of DIP 46 in the event one or more pins appear on the opposite side of container 10. After electrical connection is made between the pins and connectors, they are likewise potted with a sealing composition as hereinbefore mentioned. The sealing composition provides electrical insulation, a mechanical seal of the battery, and protection of the electrical devices connected to the battery.

Although certain embodiments of the invention have been illustrated in the accompanying drawings and described in the foregoing detailed description, it is to be understood that the invention is not to be limited to the embodiments specifically disclosed, but is capable of numerous modifications and substitutions without departing from the spirit and scope of the invention as defined in the hereinafter appended claims.

What is claimed is:

1. A battery package which comprises:
    (a) a generally hollow container member defined by a floor and side walls attached to the floor, said side walls having an open upper lip surface; a groove through the inside surface of one of said side walls extending from said upper lip surface to said floor; a second groove through the inside surface of one of said side walls extending from said upper lip, part of the distance toward said floor, thus defining a platform at the lowermost portion of said second groove; and
    (b) a battery disposed within the hollow container, said battery having upper and lower terminals; and
    (c) first and second generally planar, electrically conductive contacts each having a generally perpendicular, integral, pin portion formed on one end thereof; said first contact being attached to said lower battery terminal such that its pin is positioned within said first groove and extends above said upper lip surface; said second contact being attached to said upper battery terminal such that its pin is positioned within said second groove and extends above said upper lip surface and the portion of said second contact next adjacent said pin is positioned on said platform; and
    (d) a sealing composition enveloping said battery, contacts, and the portion of said pins below said lip surface.

2. The battery package of claim 1 further comprising one or more additional batteries disposed within said hollow container such that said batteries are electrically connected.

3. The battery package of claim 1 further comprising a third groove through the inside surface of one of said side walls extending from said upper lip surface to said floor; a second battery having upper and lower terminals disposed within said container; a third generally planar, electrically conductive contact having a generally perpendicular, integral, pin portion formed on one end thereof, said third contact being attached to the lower terminal of said second battery such that its pin is positioned within said third groove and extends above said upper lip surface; said second contact being attached to the upper terminals of both batteries; and a sealing composition enveloping said second battery, third contact and pin below said upper lip surface.

4. A battery powered integrated circuit article which comprises a dual-in-line integrated circuit member; the battery package of claim 1 electrically connected thereto by means of said pins at a junction; and a sealing composition enveloping said junction.

5. A battery powered integrated circuit article which comprises a dual-in-line integrated circuit member; the battery package of claim 3 electrically connected thereto by means of said pins at a junction; and a sealing composition enveloping said junction.

6. The battery package of claim 1 wherein said sealing composition comprises one or more compounds selected from the group consisting of silicones, polyurethanes, polyesters, epoxies and acrylics.

7. The battery package of claim 3 wherein said sealing composition comprises one or more compounds selected from the group consisting of silicones, polyurethanes, polyesters, epoxies and acrylics.

8. The article of claim 4 wherein said sealing composition comprises one or more compounds selected from the group consisting of silicones, polyurethanes, polyesters, epoxies and acrylics.

9. The battery package of claim 6, wherein said sealing composition comprises a flame retardant material.

10. The battery package of claim 7, wherein said sealing composition comprises a flame retardant material.

11. The article of claim 8, wherein said sealing composition comprises a flame retardant material.

12. The battery package of claim 1 wherein said grooves are positioned on the same side wall.

13. The battery package of claim 1, wherein said grooves are positioned on opposite side walls.

14. The battery package of claim 1 wherein said contacts are spot welded to said battery terminals.

15. A method for producing a battery package which comprises:
   (a) providing a generally hollow container member defined by a floor and side walls attached to the floor, said side walls having an open upper lip surface; a groove through the inside surface of one of said side walls extending from said upper lip surface to said floor; a second groove through the inside surface of one of said side walls extending from said upper lip, part of the distance toward said floor, thus defining a platform at the lowermost portion of said second groove; and
   (b) providing a battery having upper and lower terminals; and
   (c) providing first and second generally planar, electrically conductive contacts each having a generally perpendicular, integral, pin portion formed on one end thereof; attaching said first contact to said lower battery terminal and attaching said second contact to said upper battery terminal; inserting said second contact into said container such that its pin is positioned within said second groove and extends above said upper lip surface and the portion of said second contact next adjacent said pin is positioned on said platform; and inserting said first contact into said container such that its pin is positioned within said first groove and extends above said upper lip surface; and
   (d) enveloping said battery, contacts, and the portion of said pins below said lip surface with a sealing composition.

16. The method of claim 15 further comprising electrically attaching an integrated circuit member to said battery by means of said pins at a junction; and enveloping said junction with a sealing composition.

17. The method of claim 15 wherein said sealing composition comprises one or more compounds selected from the group consisting of silicones, polyurethanes, polyesters, epoxies and acrylics.

18. The method of claim 15, wherein said sealing composition comprises a flame retardant material.

19. The method of claim 16 wherein said sealing composition comprises one or more compounds selected from the group consisting of silicones, polyurethanes, polyesters, epoxies and acrylics.

20. The method of claim 16, wherein said sealing composition comprises a flame retardant material.

* * * * *